(12) United States Patent
Tani

(10) Patent No.: US 7,391,419 B2
(45) Date of Patent: Jun. 24, 2008

(54) INFORMATION DISTRIBUTION SYSTEM

(75) Inventor: Okie Tani, Tokyo (JP)

(73) Assignee: Tani Electronics Corporation, Tokyo (JP)

( * ) Notice: Subject to any disclaimer, the term of this patent is extended or adjusted under 35 U.S.C. 154(b) by 896 days.

(21) Appl. No.: 10/151,994

(22) Filed: May 22, 2002

(65) Prior Publication Data

US 2002/0178280 A1    Nov. 28, 2002

(30) Foreign Application Priority Data

May 28, 2001    (JP)    ............................. 2001-158864

(51) Int. Cl.
G06T 11/00    (2006.01)
(52) U.S. Cl. ........................ 345/467; 345/471; 345/589; 345/601; 382/176; 382/177; 382/229; 709/231; 715/236; 715/237; 715/239; 715/275
(58) Field of Classification Search ................ 345/501, 345/589; 709/231
See application file for complete search history.

(56) References Cited

U.S. PATENT DOCUMENTS

| | | | | |
|---|---|---|---|---|
| 5,832,530 A * | 11/1998 | Paknad et al. ............... | 715/500 |
| 5,918,238 A * | 6/1999 | Hayashi ....................... | 715/526 |
| 6,014,133 A * | 1/2000 | Yamakado et al. .......... | 345/501 |
| 6,219,788 B1 * | 4/2001 | Flavin et al. ................. | 713/194 |
| 6,505,256 B1 * | 1/2003 | York ........................... | 709/246 |
| 6,611,356 B1 * | 8/2003 | Shimizu et al. .............. | 358/1.9 |
| 6,701,008 B1 * | 3/2004 | Suino .......................... | 382/164 |
| 6,911,987 B1 * | 6/2005 | Mairs et al. ................. | 345/557 |
| 2002/0054316 A1 * | 5/2002 | Abe ............................ | 358/1.14 |
| 2002/0178280 A1 * | 11/2002 | Tani ........................... | 709/231 |

FOREIGN PATENT DOCUMENTS

| | | |
|---|---|---|
| JP | A 09-093242 | 4/1997 |
| JP | A 10-055420 | 2/1998 |
| KR | A-1020000054486 | 9/2000 |

OTHER PUBLICATIONS

"Definition of grammer—Merriam-Webster Online Dictionary" http://www.m-w.com/dictionary/grammar. Accessed online Oct. 17, 2007.*

* cited by examiner

Primary Examiner—Kee Tung
Assistant Examiner—Antonio A Caschera
(74) Attorney, Agent, or Firm—Oliff & Berridge, PLC

(57) ABSTRACT

An information distribution system configured to deliver various types of content provided by an information distributor to information receivers through a network and transmitting the content to be distributed converted to colors, color values, or color digital values. By converting the content to colors, color values, or color digital values, it is possible to reduce the amount of information transmitted. Due to this, it becomes possible to shorten the time required for distribution of content and to improve practicality. Further, it becomes possible to reduce the distribution costs.

12 Claims, 7 Drawing Sheets

FIG. 4

| FIRST LETTER (1ST LEVEL) 26 | OBJECT (2ND LEVEL) 27 | COLOR 14a | | COLOR VALUE 14b | | COLOR DIGITAL VALUE 14c | |
|---|---|---|---|---|---|---|---|
| | | 1ST LEVEL | 2ND LEVEL | 1ST LEVEL | 2ND LEVEL | 1ST LEVEL | 2ND LEVEL |
| A | APARTMENT | RED 1 | BLUE 1 | 11 | 21 | FF0000 | 0000FF |
| | ALAMO BAY RECLAMATION PROJECT | | BLUE 2 | | 22 | | 1100FF |
| | AEROSPACE DEVELOPMENT COMMISSION | | BLUE 3 | | 23 | | 2200FF |
| | ... | | ... | | ... | | ... |
| B | BAD RISK | BLUE 1 | RED 1 | 21 | 11 | 0000FF | FF0000 |
| | BUREAU OF HOUSING | | RED 2 | | 12 | | FF0011 |
| | ... | | ... | | ... | | ... |
| ... | ... | ... | ... | ... | ... | ... | ... |
| N | NO CONFIDENCE MOTION | RED 2 | BLUE 1 | 12 | 21 | FF0011 | 0000FF |
| | ... | | ... | | ... | | ... |

FIG. 5

| FIRST LETTER (1ST LEVEL) | OBJECT (2ND LEVEL) | COLOR | | COLOR VALUE | | COLOR DIGITAL VALUE | |
|---|---|---|---|---|---|---|---|
| | | 1ST LEVEL | 2ND LEVEL | 1ST LEVEL | 2ND LEVEL | 1ST LEVEL | 2ND LEVEL |
| A | APPLY | RED 1 | GREEN 1 | 11 | 31 | FF0000 | 00FF00 |
| | APPLIES | | GREEN 2 | | 32 | | 11FF00 |
| | APPLYING | | GREEN 3 | | 33 | | 22FF00 |
| | APPLIED | | GREEN 4 | | 34 | | 33FF00 |
| | APPLICABLE | | GREEN 5 | | 35 | | 44FF00 |
| | ... | | ... | | ... | | ... |
| B | BUY | BLUE 1 | GREEN 1 | 21 | 31 | 0000FF | 00FF00 |
| | BUYS | | GREEN 2 | | 32 | | 11FF00 |
| | BUYING | | GREEN 3 | | 33 | | 22FF00 |
| | ... | | ... | | ... | | ... |
| ... | | | | | | | |

26 — FIRST LETTER (1ST LEVEL)
27 — OBJECT (2ND LEVEL)
14a — COLOR
14b — COLOR VALUE
14c — COLOR DIGITAL VALUE

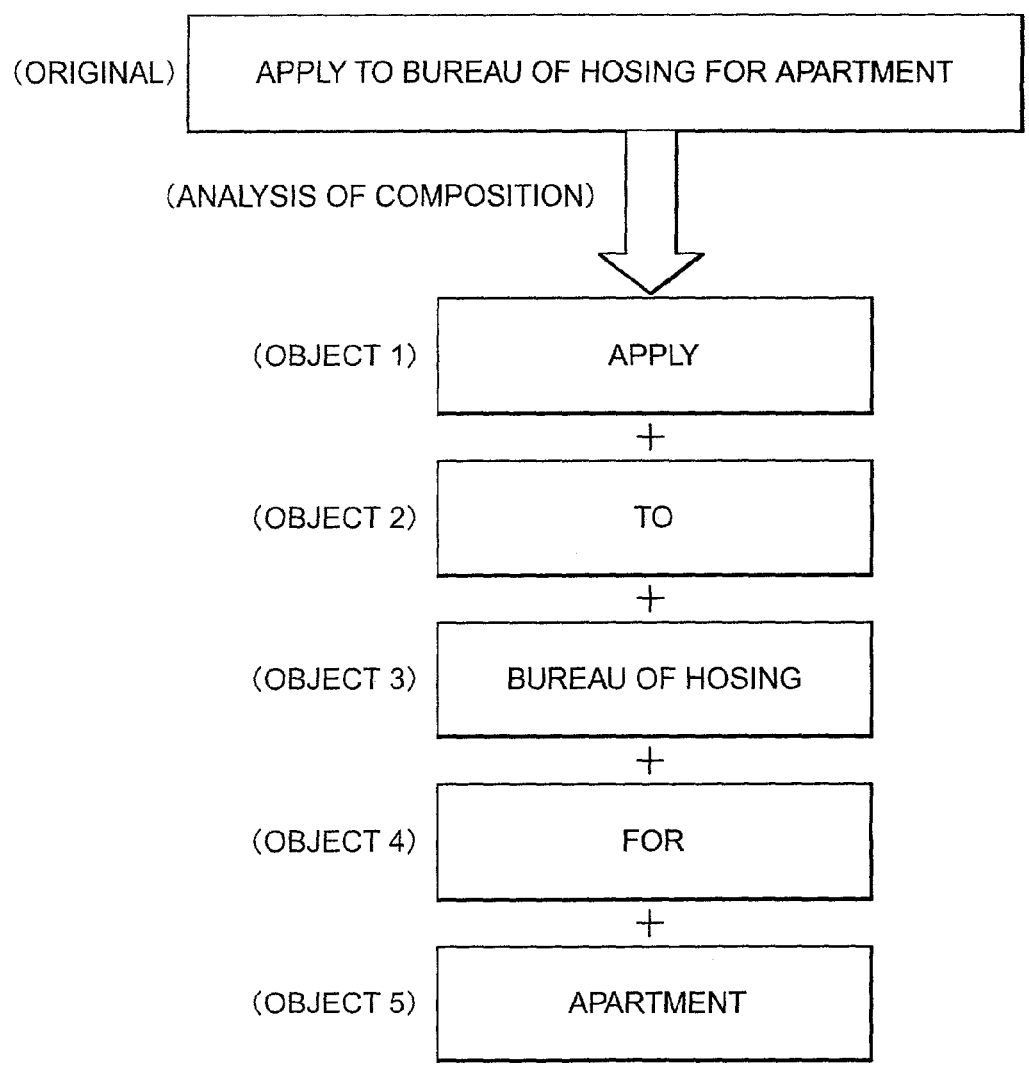

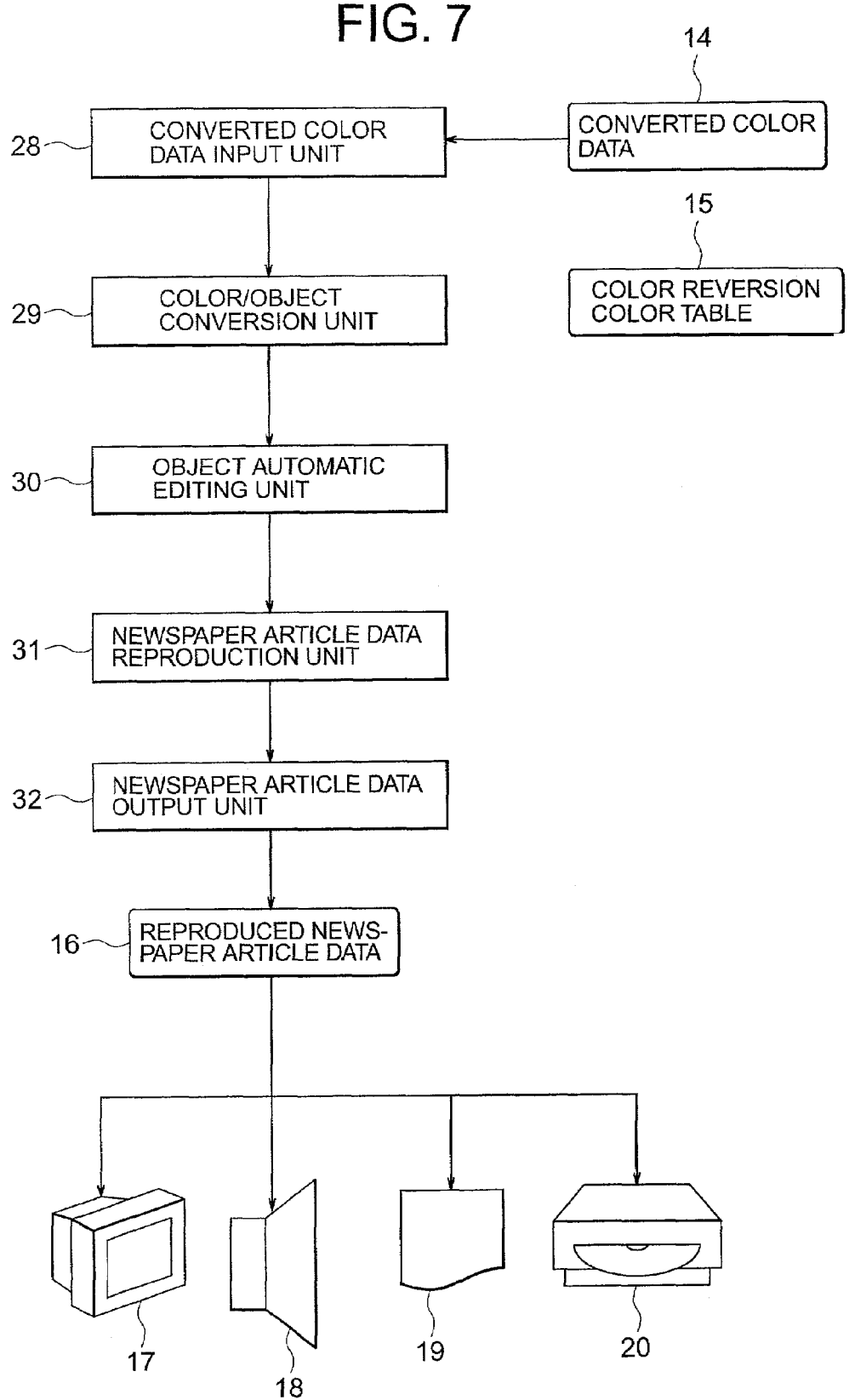

INFORMATION DISTRIBUTION SYSTEM

BACKGROUND OF THE INVENTION

1. Field of the Invention

The present invention relates to an information distribution system, more particularly relates to an information distribution system for distributing various types of information of newspapers, magazines, encyclopedias, security reports, etc. (hereinafter referred to as "content") through the Internet or another open network to information receivers. This information distribution system can distribute vast amounts of content safely at a high speed.

2. Description of the Related Art

In recent years, the spread of the Internet and other open networks (hereinafter referred to as "networks") has led to an increase in electronic newspapers, electronic books, etc. prepared and distributed by information distributors. Homes and companies are now able to receive content such as electronic newspapers and electronic books on PCs and view them online or download them for viewing.

The information distribution systems of the related art, however, are configured to distribute one day's worth of a newspaper or one volume's worth of a book as it is as text data or image data, so the amount of the information transmitted becomes enormous. Accordingly, unless a broadband network or other high-speed communications line is used, it takes too much time to distribute the information and therefore the systems are impractical. Further, even if using the high-speed communication lines, the amount of the information transmitted remains the same, so the problem arises of the distribution costs increasing in proportion to the amount of information transmitted. Further, the problem arises of the need to lay new high-speed communication lines.

Further, even if high-speed communication lines are already laid, the problem of the communication speed of the lines between the high-speed line network and the PCs remains.

SUMMARY OF THE INVENTION

An object of the present invention is to provide an information distribution system transmitting the information to be distributed converted into colors, color values, or color digital values so as to minimize the amount of information transmitted.

According to the present invention, there is provided an information distribution system for distributing newspaper, magazine, book, encyclopedia, security report, and other content provided by an information distributor to an information receiver through an open network such as the Internet. The information distribution system transmits the content to be distributed converted to colors, color values, or color digital values.

Preferably, the information distribution system divides the content to be distributed into a plurality of objects and transmits the objects converted to the colors, color values, or color digital values.

More preferably, the information distribution system divides the content into objects consisting of at least one of individual letters; entries in dictionaries such as words, phrases, personal names, place names, specialized terms, and foreign words; and word strings appearing in the content.

Alternatively or more preferably, the information distribution system provides a color conversion table for converting the content or objects to be transmitted to the colors, color values, or color digital values at the information distributor side.

Still more preferably, the information distribution system provides a color reversion table for converting back the transmitted colors, color values, or color digital values to the content or objects at the information receiver side.

Further, still more preferably, the information distribution system distributes the color reversion table to the information receiver side through the open network.

More preferably, the information distribution system outputs the content or objects converted back from the colors, color values, or color digital values by the color reversion table by display, printing, or sound.

Alternatively or still more preferably, the information distribution system makes the correspondence between the content or objects and the colors, color values, or color digital values in the color conversion table and color reversion table freely changeable.

Alternatively or still more preferably, the information distribution system makes the correspondence between the content or objects and the colors, color values, or color digital values in the color conversion table and color reversion table assignable to a hierarchical structure.

Preferably, the information distribution system distributes color reversion table designation information designating a color reversion table for use when converting back the colors, color values, or color digital values to the content or objects to information receivers before or simultaneously with transmitting the colors, color values, or color digital values.

More preferably, the color reversion table designation information is authorized to be distributed to information receivers specifically qualified by concluding a distribution agreement.

BRIEF DESCRIPTION OF THE DRAWINGS

These and other objects and features of the present invention will become clearer from the following description of the preferred embodiments given with reference to the attached drawings, wherein:

FIG. 4 is a view of an example of a color conversion table and color reversion table;

FIG. 5 is a view of another example of a color conversion table and color reversion table;

FIG. 6 is a view of an actual example of analysis of composition; and

FIG. 7 is a detailed view of the configuration of the system at the information receiver side.

DESCRIPTION OF THE PREFERRED EMBODIMENTS

Preferred embodiments of the present invention will be described in detail below while referring to the attached figures. The configurations, relative arrangements, etc. explained in the embodiments are just explained schematically to an extent enabling understanding of the present invention. Accordingly, the present invention is not limited to the embodiments described below and may be changed in various ways to an extent not departing from the scope of the technical idea indicated in the claims. In particular, importantly, in the following explanation, reference is made to an English language newspaper information distribution system for facilitating understanding of the invention, but the invention is not limited to the same and in fact was originally designed for and may be more optimally suited to languages using more complicated writing systems employing combinations of phonetic syllabary and ideographs such as Japanese and therefore requiring much more data to encode and transmit.

Figure 1:
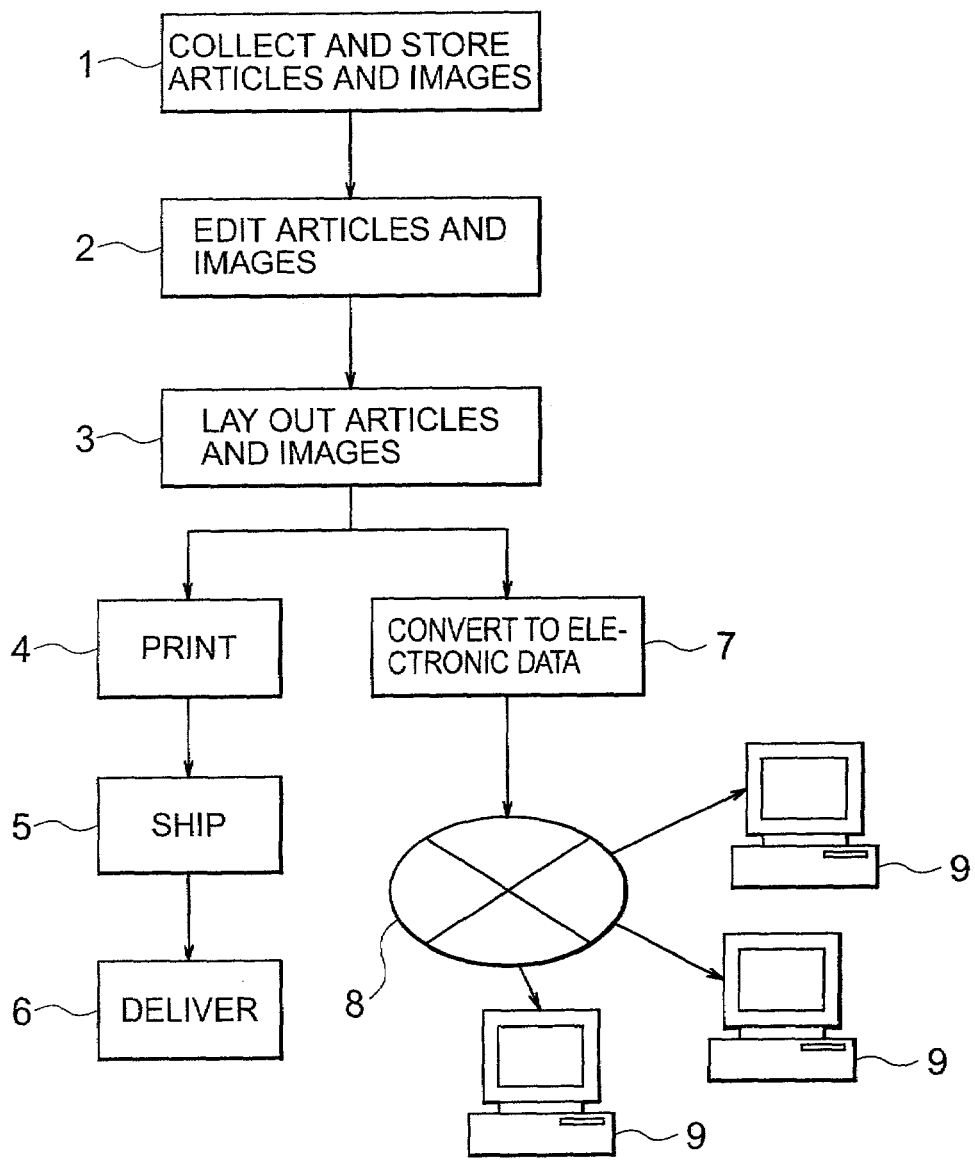
FIG. 1 is a flow chart of production of a newspaper.

FIG. 1 is a flow chart of the production of a newspaper. Step 1 consists of the collection and storage of articles and images. This step 1 collects and stores articles and images sent from news sites, branch offices, other news agencies, etc.

Step 2 consists of the editing of the articles and images. This step 2 selects and edits the suitable articles and images to be carried in the newspaper from the large number of articles and images collected and stored at step 1.

Step 3 consists of the layout of the articles and images. This step 3 attaches headlines etc. to the articles and images edited at step 2 and lays out the pages.

Step 4 consists of the printing. This step 4 uses film of the laid out copy produced at step 3 to print the newspaper by a printing press.

Step 5 consists of the shipping step. This step 5 divides the newspapers printed at step 4 for the different destinations, then ships them to newspaper delivery centers.

Step 6 consists of the delivery step. This step 6 delivers the newspapers from the newspaper delivery centers to the different homes. Steps 1 to 6 show the process of newspaper production by paper as in the past.

Step 7 consists of the conversion of the newspaper to electronic data. In recent years, more and more electronic versions of newspapers have been produced. This step 7 delivers the electronic data of the newspaper to terminals 9 through the network 8. The information distribution system according to the present invention is used for distribution of newspaper information from step 7 on.

Figure 2:
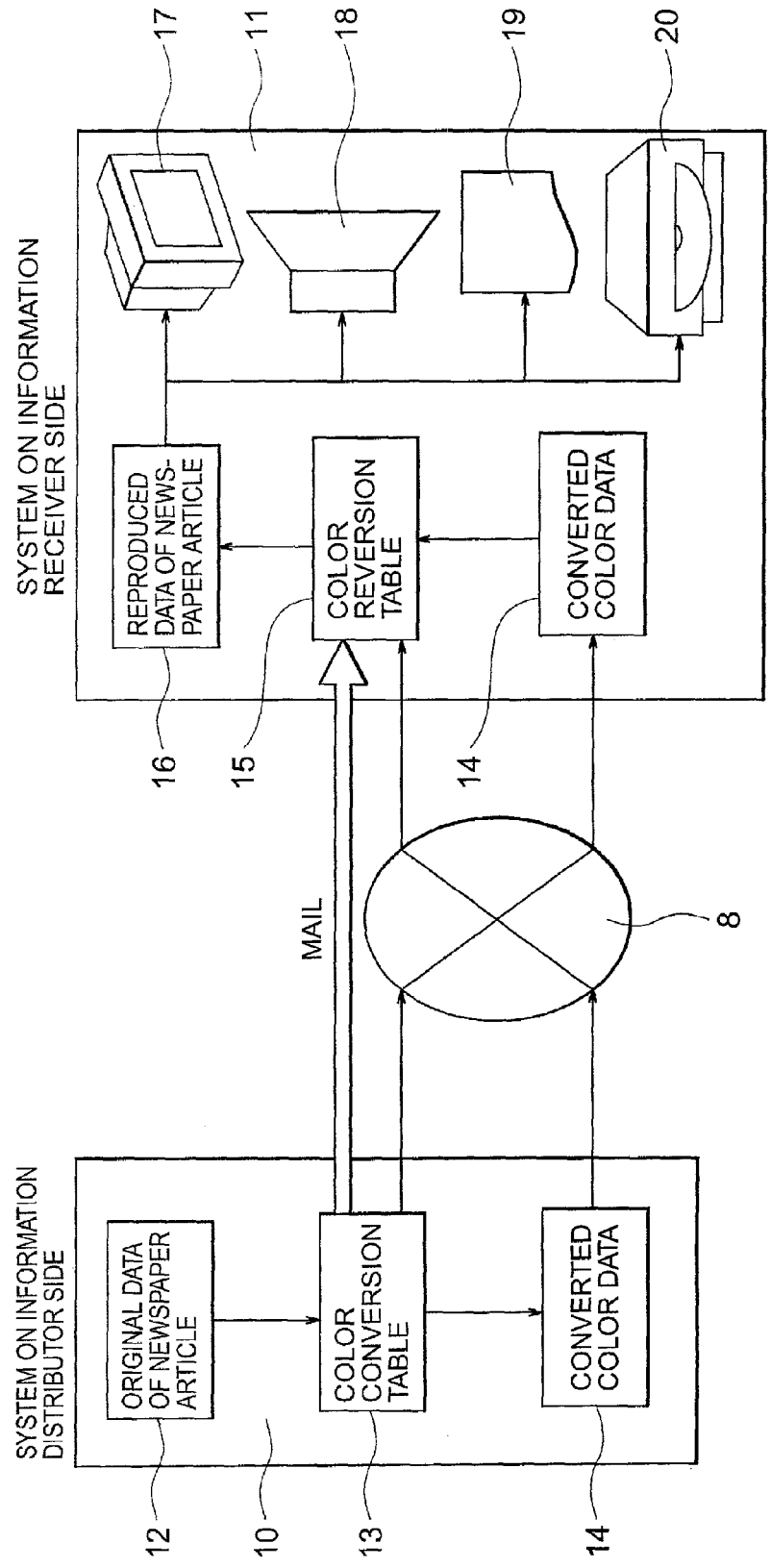
FIG. 2 is a view of the configuration of a newspaper information distribution system.

FIG. 2 is a view of the configuration of a newspaper information distribution system. In this newspaper information distribution system, reference numeral 10 shows the system at the information distributor side, while reference numeral 11 shows the system at the information receiver side. The information distributor side system 10 corresponds to step 7, while the information receiver side system 11 corresponds to any one of the above terminals 9.

The information distributor side system 10 converts the newspaper article original data 12 to converted color data 13 by a color conversion table 13. Details will be explained later. Further, the information receiver side system 11 converts the converted color data 14 delivered through the network 8 back to the reproduced newspaper article data 16 by a color reversion table 15. The reproduced newspaper article data 16 is output as an image by a display 17, output as speech or sound by a speaker 18, or output as papers by a printer 19. Further, it is output for recording and storage in a storage device 20. These types of output may be performed independently or freely combined.

The color conversion table 13 encodes the newspaper article original data 12 to the converted color data 14. The color reversion table 15 decodes the newspaper article original data 12 which had been encoded to the converted color data 14 by the color conversion table 13 to the reproduced newspaper article original data 16. The color reversion table 15 is provided at the information receiver side system 11 by transmission over the network 8 or the mail.

Figure 3:
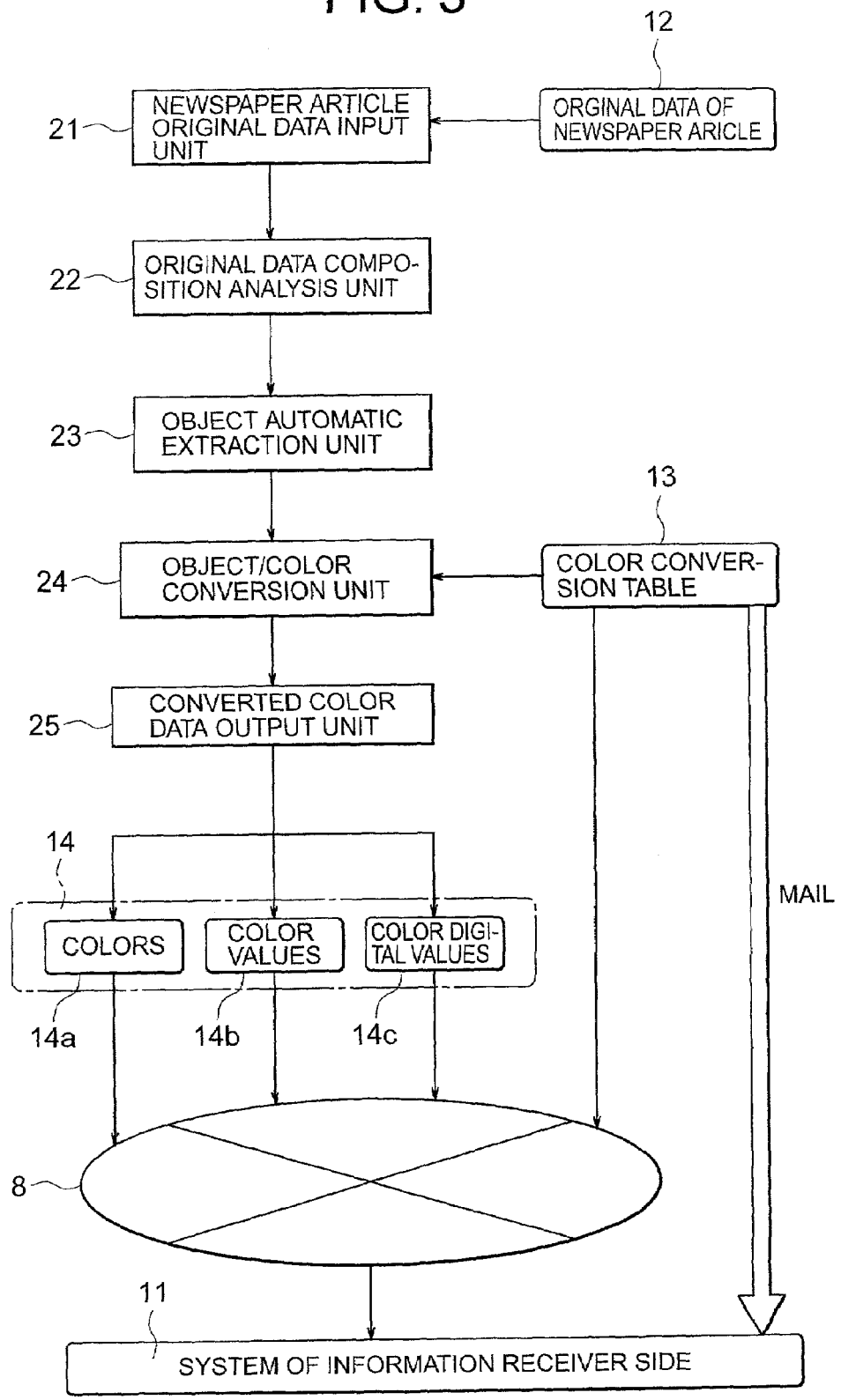
FIG. 3 is a detailed view of the configuration of the system at the information distributor side.

FIG. 3 shows the detailed configuration of the information distributor side system 10. In FIG. 3, reference numeral 21 shows a newspaper article original data input unit. The newspaper article original data input unit 21 may receive as input the newspaper article original data 12.

Reference numeral 22 is an original data composition analysis unit. The original data composition analysis unit 22 analyzes the sentence structure of the newspaper article original data 12 input to the newspaper article original data input unit 21 and breaks it down into individual letters; words, phrases, personal names, place names, specialized terms, foreign words, and other entries in various types of dictionaries; or word strings frequently appearing in the newspaper article original data 12. Note that the individual letters broken down by the original data composition analysis unit 22 are letters for each type of word such as verbs, adjectives, adverbs, etc. Further, verbs with changes in form, adjectives, adverbs, etc. are broken down for each form of use.

Reference numeral 23 is an object automatic extraction unit. The object automatic extraction unit 23 extracts the individual letters, entries in various dictionaries, or word strings broken down by the original data composition analysis unit 22 as objects.

Reference numeral 24 is an object/color conversion unit. The object/color conversion unit 24 refers to the color conversion table 13 prepared in advance to convert the objects extracted by the object automatic extraction unit 23 to colors 14a, color values 14b, or color digital values 14c as converted color data 14 corresponding to the objects. Details of the colors 14a, color values 14b, and color digital values 14c will be explained later. Note that in this embodiment, the explanation was given of a configuration preparing a color conversion table 13 in advance, but the present invention is not limited to this. A color conversion table 13 may be automatically generated each time a new object is extracted by the object automatic extraction unit 23 by newly assigning a color 14a, color value 14b, or color digital value 14c by using a known automatic dictionary preparation method.

Reference numeral 25 is a converted color data output unit. The converted color data output unit 25 selectively outputs colors 14a, color values 14b, or color digital values 14c obtained by conversion at the object/color conversion unit 24. The selectively output colors 14a, color values 14b, or color digital values 14c are transmitted to the information receiver side system 11 through the network 8.

FIG. 4 shows an example of a color conversion table 13 and color reversion table 15 used in a newspaper information distribution system. In the conversion or reversion table, information is arranged alphabetically in two levels. In the figure, reference numeral 26 shows the rows of individual letters as a first level. Each row 26 is divided into objects 27 as a second level. Note that FIG. 4 shows part of a color conversion table 13 and color reversion table 15, in particular shows nouns with no changes in form.

Each object 27 may be expressed by colors 14a each comprised of two specific colors. Specifically, one object 27 is expressed by a minimum of two pixels. That is, colors 14a are output as the converted color data 14 from the converted color data output unit 25 by the method of using the object/color conversion unit 24 read printed matter consisting of sets of color dots of one pixel per level each and then output the colors.

Assuming that printed matter consisting of sets of color dots is printed at a density of 1200 dpi, 1.44 million dots are printed per square inch. That is, in the case of the present embodiment expressing one object by two dots, it is possible to store an extremely vast amount of information of 720,000 objects on one square inch of paper. Further, if converting the printed matter to A4 size paper, it is possible to store information of about 70 million objects or as much as 97 times the above figure. If the number of individual letters used per day of a newspaper were 400,000 letters and average number of letters for one object were three, it would be possible to store about 1.4 years' worth of newspaper articles on one sheet of A4 size paper. Note that if only one level was used in the color conversion table 13 and color reversion table 15, the amount of information stored would double of course.

Each object 27 may also be expressed by color values 14b each comprised of a total of four freely assigned numerals, that is, two numerals for each level. That is, the color values 14b are output as the converted color data 14 from the converted color data output unit 25 by the method of having the object/color conversion unit 24 directly output four numerals. Note that the number of numerals of each level is not limited to two. It is possible to freely set the number in accordance with the size of the color conversion table 13 and color reversion table 15.

Each object 27 may also be expressed by color digital values 14c each comprised of a total of 24 bits for each level, that is, a total of 48 bits of RGB data. That is, the color digital values 14c are output as the converted color data 14 by the method of having the object/color conversion unit 24 directly output 48 bits of data. Note that the number of bits for each layer is not limited to 24 bits and can be set to any number in accordance with the size of the color conversion table 13 and color reversion table 15.

FIG. 5 shows a table of verbs with changes in form in the table shown in FIG. 4 as an example of the color conversion table 13 and color reversion table 15. The structure of the table in this example is the same as the example shown in FIG. 4, so the same reference numerals are assigned and detailed explanations are omitted.

Next, the color conversion tables 13 shown in FIG. 4 and FIG. 5 will be used to explain the processing in the original data composition analysis unit 22 and the object automatic extraction unit 23. As one example, the case of analyzing newspaper article original data 12 comprised of the 34 letters of "APPLY TO BUREAU OF HOUSING FOR APARTMENT" input to the newspaper article original data input unit 21 by the original data composition analysis unit 22 will be explained using FIG. 6. As shown in FIG. 6, the original "APPLY TO BUREAU OF HOUSING FOR APARTMENT" is broken down by the original data composition analysis unit 22, whereby five objects of object 1 to object 5 are extracted by the object automatic extraction unit 23. Due to this, the 34 letters of the original are converted to five sets of, that is, ten, color dots and expressed by an average of 6.8 letters' worth of data per set. Note that in FIG. 6, object 2 and object 4 are particles. If preparing the color conversion table 13 in a form joining them with the previous objects, that is, the object 2 with the object 1 and the object 4 with the object 3, it becomes possible to express the 34 letters by three sets of, that is, six, color dots.

FIG. 7 is a detailed view of the configuration of the information receiver side system 11. In FIG. 7, reference numeral 28 shows the converted color data input unit. The converted color data input unit 28 receives as input the converted color data 14 transmitted through the network 8.

Reference numeral 29 shows a color/object conversion unit. The color/object conversion unit 29 converts the converted color data 13 input to the converted color data input unit 28 to objects corresponding to the converted color data 14 by referring to the color reversion table 15 distributed through the network 8 or mailed in advance. Here, when using the colors 14a as the converted color data 14, it is also possible to output the printed matter comprised of sets of color dots before conversion to objects, then convert the printed matter to objects corresponding to the colors 14a by the color/object conversion unit 29.

Reference numeral 30 shows an object automatic editing unit. The object automatic editing unit 30 recomposes the objects converted at the color/object conversion unit 29 to the sentences of the newspaper article original data 12.

Reference numeral 31 shows a newspaper article data reproduction unit. This newspaper article data reproduction unit 31 divides the sentences recomposed at the object automatic editing unit 30 into headlines, text, etc. in the same way as the conventional layout step 3 and reproduces the paper layout.

Reference numeral 32 shows a newspaper article data output unit. This newspaper article data output unit 32 outputs the reproduced newspaper article data 16 reproduced at the newspaper article data reproduction unit 31 by a display 17, speaker 18, printer 19, or storage device 20 alone or in combination.

Based on the above configuration, the newspaper information is distributed upon instruction of the information distributor or request of the information receiver. Even when using color digital values 14c comprised of two levels, the converted color data 14 transmitted through the network 8 becomes very short in length. In the case of a Japanese language system, the converted color data 14 transmitted through the network 8 becomes a maximum of three Japanese kanji ideographs' (48 bits') worth of data in length. The longer the corresponding objects 27, the more easily it is to deliver newspaper information with a high compression rate. In particular, in the case of use of the color conversion table 13 and the color reversion table 15 as shown in FIG. 4 and FIG. 5, the compression rate becomes remarkably high.

Further, in the present embodiment, the explanation was given assuming a fixed correspondence among the objects 27 and colors 14a, color values 14b, and color digital values 14c. That is, as shown in FIG. 4 and FIG. 5, objects 2 and colors 14a, color values 14b, and color digital values 14c were converted back and forth in the same row. When, for example, converting back and forth between objects 27 and colors 14a, color values 14b, and color digital values 14c in different lines, however, it is also possible to transmit correspondence changing information to the information receivers simultaneously with the distribution of information or in advance and make the correspondence freely changeable.

Due to this, it is possible to not transmit correspondence changing information to information receivers other than specific receivers whose distribution agreements remain valid and therefore are qualified to receive it. Therefore, information receivers whose agreements for information distribution have expired cannot correctly reproduce the newspaper information, and illegitimate viewing of newspaper information can be prevented.

In the present embodiment, the color conversion table 13 and the color reversion table 15 were explained as single tables, but it is also possible to prepare a plurality of color conversion tables 13 and distribute a plurality of color reversion tables 15 corresponding to them. In this case, it is sufficient to transmit color reversion table designating information indicating which color reversion table to use at the time of distribution of information simultaneous with the distribution of information or in advance.

While the invention has been described with reference to a specific embodiment chosen for purpose of illustration, the present invention is not limited to the newspaper information distribution system in the embodiment. It may also be applied to an information distribution system for various content including vast amounts of information such as of magazines, books, encyclopedias, security reports and the like. It should be apparent that numerous modifications could be made thereto by those skilled in the art without departing from the basic concept and scope of the invention.

According to the present invention, it is possible to transmit the tremendous amounts of data about various content of newspapers, magazines, books, encyclopedias, security reports, etc. in a radically compressed form on the Internet or another open network. Therefore, it is possible to distribute information at a high speed even by a conventional communications line rather than a high-speed communications line of a broadband network etc. The data transmitted over the network is converted color data which in itself is not data of any meaning, so it is possible to distribute information safely without leakage of the content of the information to a third party. Further, it is possible to easily manage the color reversion table distributed to the information receivers.

The present disclosure relates to subject matter contained in Japanese Patent Application No. 2001-158864, filed on May 28, 2001, the disclosure of which is expressly incorporated herein by reference in its entirety.

What is claimed is:

1. An information distribution system for distributing information to an information receiver through an open network, wherein said information is divided into a plurality of text objects based on sentence structure of said information analyzed by an original data composition analysis unit, the text objects are converted to at least one of colors, color values, and color digital values, and said information distribution system transmitting said at least one color, color values, and color digital values, the information distribution system comprising:
 an information distributor comprising:
  a memory that stores a color conversion table; and
  an object/color conversion unit for referring to the color conversion table and converting said text objects to be transmitted to any one of said colors, said color values, and said color digital vaules;
 said information receiver comprising:
  a memory that stores a color reversion table; and
  an object/color reversion unit for referring to the color reversion table and converting back said transmitted colors, said color values, and said color digital values to said text objects;
 wherein when distributing said information from said information distributor to said information receiver through said open network, said information is transmitted as data with a high compression rate by using the colors.

2. The information distribution system as set forth in claim 1, wherein said text objects include at least one of individual letters, entries in dictionaries, and word strings appearing in said information.

3. The information distribution system as set forth in claim 1, wherein said color reversion table is distributed to said information receiver side through said open network.

4. The information distribution system as set forth in claim 3, wherein said text objects converted back from said colors, color values, and color digital values by said color reversion table is output by any means selected from display, printing, and sound.

5. The information distribution system as set forth in claim 1, wherein said text objects converted back from said colors, color values, and color digital values by said color reversion table is output by any means selected from display, printing, and sound.

6. The information distribution system as set forth in claim 1, wherein the correspondence between said text objects and said colors, color values, and color digital values in said color conversion table is made freely changeable.

7. The information distribution system as set forth in claim 1, wherein the correspondence between said text objects and said colors, color values, and color digital values in said color reversion table is made freely changeable.

8. The information distribution system as set forth in claim 1, wherein the correspondence between said text objects and said colors, color values, and color digital values in said color conversion table is made assignable to a hierarchical structure.

9. The information distribution system as set forth in claim 1, wherein the correspondence between said text objects and said colors, color values, and color digital values in said color reversion table is made assignable to a hierarchical structure.

10. The information distribution system as set forth in claim 1, wherein color reversion table designation information designating a color reversion table for use when converting back said colors, color values, and color digital values to said text objects to information receivers is performed before or simultaneously with transmitting said colors, color values, and color digital values.

11. The information distribution system as set forth in claim 10, wherein said color reversion table designation information is authorized to be distributed to information receivers specifically qualified by concluding a distribution agreement.

12. An information distribution system for distributing information to an information receiver through an open network, wherein said information is divided into a plurality of text objects based on grammar, the text objects are converted to at least one of colors, color values, and color digital values, and said information distribution system transmitting said at least one color, color values, and color digital values, the information distribution system comprising:
 an information distributor comprising:
  a memory that stores a color conversion table; and
  an object/color conversion unit for referring to the color conversion table and converting said text objects to be transmitted to any one of said colors, said color values, and said color digital values, wherein
  the color conversion table is not derived from the information distributed to the information receiver.

* * * * *